US005345190A

United States Patent [19]

Kaylor

[11] Patent Number: 5,345,190

[45] Date of Patent: Sep. 6, 1994

[54] MODULAR LOW VOLTAGE FILTER WITH COMMON MODE FEEDBACK

[75] Inventor: Scott A. Kaylor, Gilbert, Ariz.

[73] Assignee: Motorola, Inc., Schaumburg, Ill.

[21] Appl. No.: 100,830

[22] Filed: Aug. 2, 1993

[51] Int. Cl.[5] .................... H03F 3/45

[52] U.S. Cl. .................... 330/258; 330/303

[58] Field of Search .................... 330/253, 258, 259, 303, 330/69

[56] References Cited

U.S. PATENT DOCUMENTS

| | | | |
|---|---|---|---|
| 3,845,404 | 10/1974 | Trilling | 330/258 |
| 4,780,690 | 10/1988 | Voorman | 330/303 |
| 4,820,998 | 4/1989 | Roessler | 330/253 |
| 4,904,953 | 2/1990 | McCormack | 330/253 |

OTHER PUBLICATIONS

Geert A. DeVeirman et al., "Monolithic 10–30 MHz Tunable Bipolar Bessel Lowpass Filter", IEEE Proc. ISCAS, pp. 1444–1447, 1991, Paper 7–D.2.

*Primary Examiner*—Steven Mottola

*Assistant Examiner*—Tiep H. Nguyen

*Attorney, Agent, or Firm*—Michael D. Bingham; Gary W. Hoshizaki

[57] ABSTRACT

A modular filter (11) that operates at low voltages and utilizes common mode feedback is described. The modular filter (11) receives an input differential signal and provides a filtered output differential signal. The modular filter (11) comprises a load circuit (15), a first transconductor (18), a second transconductor (24), an amplifier (19), and a common mode amplifier (26). The first transconductor (18) has a transconductance gml and the second transconductor (24) has a transconductance $g_{m2}$. The amplifier has a gain K. The modular filter (11) provides a transfer function of $V_o/V_i=(g_{m1}/g_{m2})*((1+(sKC_a/g_{m1}))/(1+(s(C_a+C_b)/g_{m2}))$, where $C_a$ are capacitors (21 and 22) that capacitively couple outputs of the amplifier (19) to the load circuit (15) and $C_b$ are capacitors (27 and 28) that capacitively couples the output of the common mode amplifier (26) to the load circuit (15). The common mode amplifier (26) controls loading provided by the load circuit (15).

20 Claims, 4 Drawing Sheets

MODULAR LOW VOLTAGE FILTER WITH COMMON MODE FEEDBACK

BACKGROUND OF THE INVENTION

This invention relates, in general, to filters, and more particularly to low voltage filters.

It is well known by one skilled in the art that power supply voltages for integrated circuits are constantly being reduced. The reduction in power supply voltages is mainly due to device constraints and to lower power dissipation. For example, complementary metallic oxide semiconductor (CMOS) is currently migrating from a five volt power supply voltage to a three volt power supply voltage.

Active filter designs do not readily translate to a lower power supply voltage. The linear range of a filter is substantially decreased. Lowering power supply voltages reduces bias head room for the active filter circuitry. Other parameters that affect the filter design are tuning range, power supply noise rejection, circuit complexity, and total power dissipation.

It would be of great benefit if a modular filter could be designed to operate at low voltages whilst being fully differential to maximize noise rejection, and simple in design, and low power.

SUMMARY OF THE INVENTION

Briefly stated, this invention is a modular filter for filtering an electronic signal. The modular filter operates at low voltages and is programmable to provide different filtering characteristics. The modular filter receives an input differential signal and provides a filtered output differential signal. The modular filter comprises a first transconductor, a second transconductor, an amplifier, a common mode amplifier, and a load circuit.

The load circuit has a first terminal and a second terminal for summing signals. Loading presented at the first and second terminals of the load circuit is variable and controlled by a control signal.

The first transconductor has a first predetermined transconductance and is responsive to the input differential signal. The first transconductor provides a differential signal to the first and second terminals of the load circuit.

The amplifier is responsive to the input differential signal and has a predetermined gain. The amplifier is capacitively coupled to the first and second terminals of the load circuit for providing a differential signal to the load circuit.

The common mode amplifier is responsive to the filtered output differential signal and a common mode reference voltage. The common mode amplifier is capacitively coupled to the first and second terminals of the load circuit and provides the control signal for varying loading of the load circuit.

The second transconductor has a second predetermined transconductance and is responsive to the filtered output differential signal. The second transconductor provides a differential signal to the first and second terminals of the load circuit.

DETAILED DESCRIPTION OF THE DRAWINGS

Figure 1:
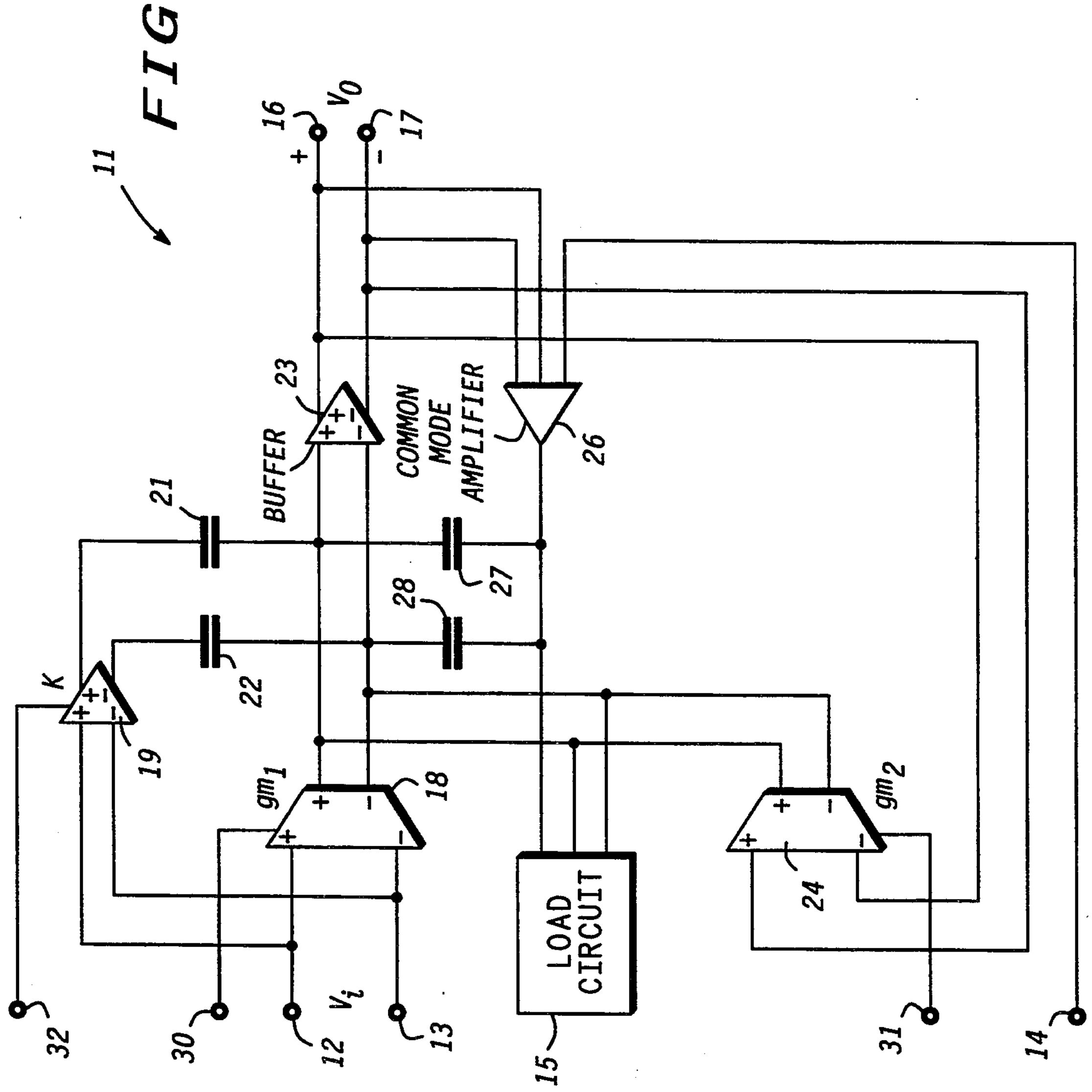
FIG. 1 is a block diagram of a modular filter in accordance with the present invention.

FIG. 1 is a block diagram of a modular filter 11 in accordance with the present invention. Modular filter 11 is fully differential to increase power supply noise rejection and is capable of low voltage operation while providing common mode feedback to stabilize the common mode levels. Modular filter 11 is modular to allow further stages to be added to form different filter functions. For example, a continuous time biquadratic filter can be formed from modular filter 11.

Modular filter 11 includes an input 12, an input 13, a reference input 14, a control input 30, a control input 31, a control input 32, an output 16, and an output 17. An input differential signal ($V_i$) is applied across inputs 12 and 13 of modular filter 11 and a filtered output differential signal ($V_o$) is provided at outputs 16 and 17. The filter response is generated through the use of transconductors and capacitors and can be characterized by a transfer function.

Modular filter 11 is designed to be tunable over a wide frequency range. For example, if modular filter 11 is configured for a low pass filter, a tuning range for the cutoff frequency might range from 3 megahertz (MHz) to 70 MHz. Tuning for modular filter 11 is achieved by changing bias voltages on control inputs 30–32. Bias voltages are applied to control inputs 30–32, varying the bias voltages changes the filter characteristics of modular filter 11.

Transconductors 18 and 24 are key elements of modular filter 11. A transconductor has a transconductance $g_m$ and provides a differential current which is a linear function of a input differential voltage. Transconductor 18 includes a positive input coupled to input 12, a negative input coupled to input 13, a control input coupled to control input 30, a positive output, and a negative output. Transconductor 18 has a transconductance $g_{m1}$, the magnitude of which can be varied by changing the bias voltage applied to control input 30. Transconductor 18 provides a differential current at its positive and negative outputs corresponding to the input differential signal $V_i$.

A differential amplifier 19 includes a positive or non-inverting input coupled to input 12, a negative or inverting input coupled to input 13, a control input coupled to control input 32, a positive output, and a negative output. Differential amplifier 19 provides a gain of K. The gain K can be varied by changing the bias voltage applied to control input 32. A capacitor 21 couples between the positive output of differential amplifier 19 and the positive output of transconductor 18. A capacitor 22 couples between the negative output of differential amplifier 19 and the negative output of transconductor 18. In the preferred embodiment, a buffer 23 provides added drive capability for modular filter 11. Buffer 23 includes a positive input coupled to the positive output of transconductor 18, a negative input coupled to the negative input of transconductor 18, a positive output coupled to output 16, and a negative output coupled to output 17. In the preferred embodiment, buffer 23 is a unity gain amplifier.

A transconductor 24 includes a positive input coupled to output 17, a negative input coupled to output 16, a control input coupled to control input 31, a positive output coupled to the positive output of transconductor 18, and a negative output coupled to the negative output of transconductor 18. Transconductor 24 has a transconductance $g_{m2}$, the magnitude of which can be varied by changing the bias voltage applied to control input 31. Transconductor 24 provides a differential current at its positive and negative outputs corresponding to the output differential signal $V_o$.

A load circuit 15 includes a control input, a load terminal coupled to the positive output of transconductor 18, and a load terminal coupled to the negative output of transconductor 18. In the preferred embodiment, a single load circuit is used for transconductors 18 and 24. Load circuit 15 provides a load to the positive and negative outputs of transconductors 18 and 24 to generate a differential voltage from the differential currents provided by transconductors 18 and 24. The control input of load circuit 15 provides a means for changing the characteristics of the loads provided by load circuit 15 as the transconductance of transconductors 18 and 24 is varied.

A common mode amplifier 26 provides control for adjusting the loads of load circuit 15. Common mode amplifier 26 includes an input coupled to output 16, an input coupled to output 17, an input coupled to reference input 14, and an output coupled to the control input of load circuit 15. A capacitor 27 is coupled between the positive output of transconductor 18 and the output of common mode amplifier 26. A capacitor 28 is coupled between the negative output of transconductor 18 and the output of common mode amplifier 26. In the preferred embodiment, the voltage at outputs 16 and 17 is averaged by common mode amplifier 26. The difference between this average voltage of outputs 16 and 17 and a common mode reference voltage applied to reference input 14 is amplified by common mode amplifier 26 (and applied to the control input of load circuit 15). In other words, common mode amplifier 26 varies the characteristics of the loads within load circuit 15 to maintain the average voltage of outputs 16 and 17 equal to the common mode reference voltage thus maintaining modular filter 11 in an acceptable operating mode.

An important aspect of modular filter 11 described in FIG. 1 is the arrangement of capacitors 21, 22, 27, 28. Capacitors 27 and 28 provide ac stabilization of the common mode feedback circuit while capacitors 21 and 22 allow a transfer function zero to be realized.

In the preferred embodiment, capacitors 21 and 22 have equal capacitance values ($C_a$) and capacitors 27 and 28 have equal capacitance values ($C_b$). Transconductor 18 and 24 have the respective transconductance of $g_{m1}$ and $g_{m2}$. Differential amplifier 19 has the gain of K. The transfer function generated by modular filter 11 is shown in equation 1.

$$V_o/V_i=(g_{m1}/g_{m2})*((1+(sKC_a/g_{m1}))/(1+(s(C_a+C_b)/g_{m2})) \quad (1)$$

The dc gain of the transfer function of modular filter 11 is $g_{m1}/g_{m2}$. The zero of the transfer function is $-g_{m1}/KC_a$. The pole of the transfer function is $-g_{m2}/(C_a+C_b)$. The location of the pole and the zero is chosen by choosing $g_{m1}$, $g_{m2}$, K, $C_a$, and $C_b$. The location of the pole and zero can be adjusted by changing $g_{m1}$, $g_{m2}$, and K by varying the bias voltages at inputs 30–32.

Figure 2:
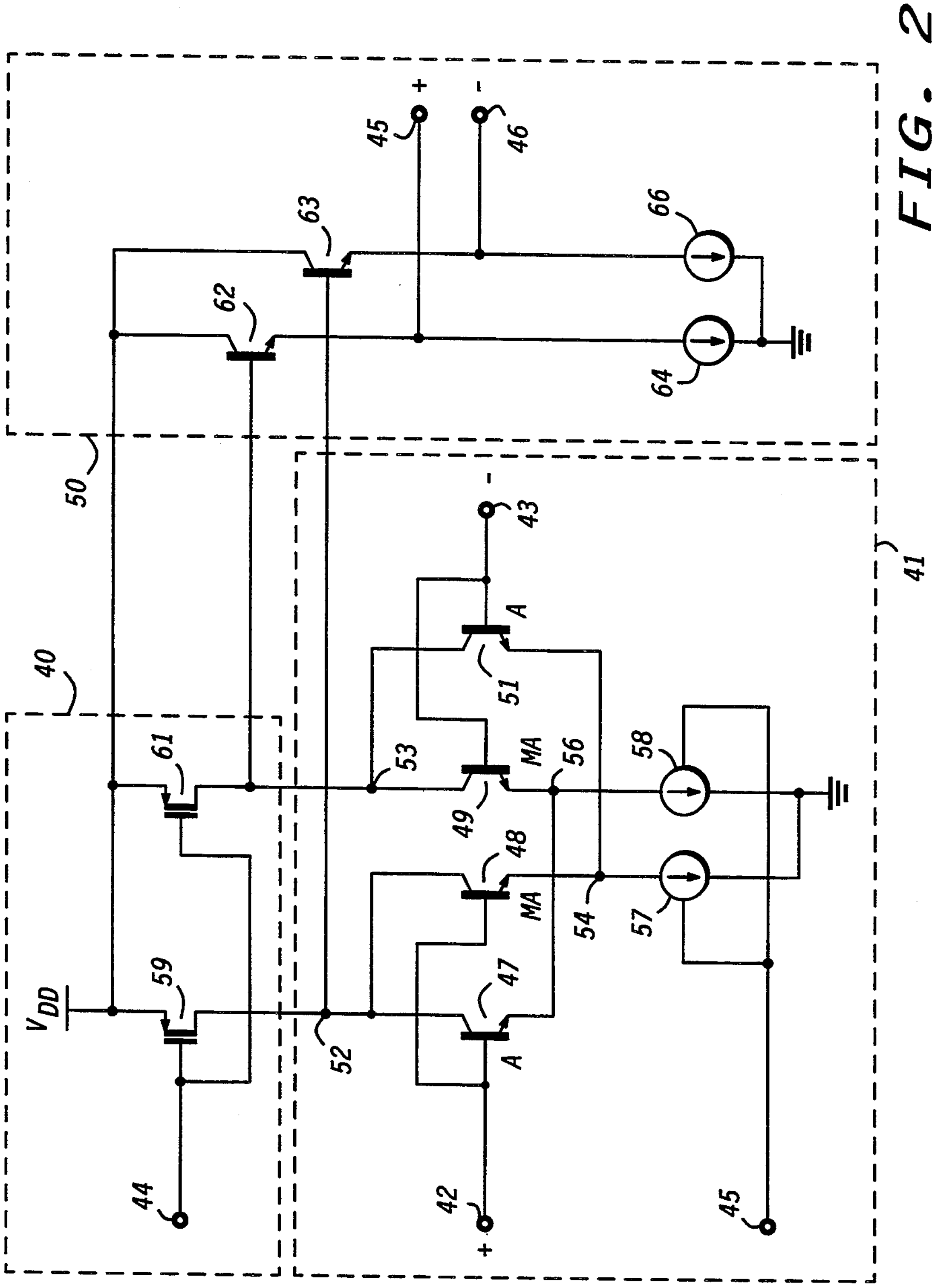
FIG. 2 is a schematic of a load circuit, a differential transconductor, and a buffer in accordance with the present invention.

FIG. 2 is a schematic of a load circuit 40, a differential transconductor 41, and a buffer 50 in accordance with the present invention. Load circuit 40, differential transconductor 41, and buffer 50 are fully differential to common mode power supply noise thereby increasing signal to noise ratio.

Differential transconductor 41 is designed to provide a linear input differential voltage to output differential current transfer function having increased input voltage range. Differential transconductor 41 and load circuit 40 are capable of operating at low voltages, for example, three volts. Differential transconductor 41 includes a positive input 42, a negative input 43, a control input 45, a positive output coupled to a node 53, and a negative output coupled to a node 52. Differential transconductor 41 comprises transistors 47, 48, 49, and 51, and current sources 57 and 58.

An input linearizer stage is used to increase linearity and range of differential transconductor 41. The input linearizer stage comprises transistors 47, 48, 49, and 51. Transistors 48 and 49 have an emitter area some multiple (M) of the emitter area (A) of transistors 47 and 51. In the preferred embodiment, transistors 47, 48, 49, and 51 are npn bipolar transistors each having a base, collector, and emitter corresponding respectively to a control input, a first terminal, and a second terminal. Transistor 47 has the base coupled to input 42, the collector coupled to node 52, and the emitter coupled to a node 56. Transistor 48 has the base coupled to input 42, the collector coupled to node 52, and the emitter coupled to a node 54. Transistor 49 has the base coupled to input 43, the collector coupled to node 53, and the emitter coupled to node 56. Transistor 51 has the base coupled to input 43, the collector coupled to node 53, and the emitter coupled to node 54. Current source 57 biases transistors 48 and 51. Current source 57 has a control input coupled to control input 45, a terminal coupled to node 54 and a terminal coupled to ground. Current source 58 biases transistors 47 and 49. Current source 58 has a control input coupled to control input 45, a terminal coupled to node 56 and a terminal coupled to ground. In the preferred embodiment, current sources 57 and 58 provide current of equal magnitude. The magnitude of the currents provided by current sources 57 and 58 can be changed by varying a bias voltage applied to control input 45. The magnitude of the currents from current sources 57 and 58 directly affects the transconductance of transconductor 41.

Load circuit 40 provides a load to differential transconductor 41 for generating a differential voltage from a differential current produced by differential transconductor 41. Load circuit 40 includes a control input 44, a load terminal coupled to node 52, and a load terminal coupled to node 53. Load circuit 40 comprises transistors 59 and 61. In the preferred embodiment, transistors 59 and 61 are enhancement p-channel MOSFETs (metallic oxide semiconductor field effect transistors). P-channel enhancement MOSFETs can be biased with a small voltage drop from drain to source which is essential for low voltage operation. Transistors 59 and 61 each include a gate, drain, and source corresponding respectively to a control input, a first terminal, and a second terminal. Transistor 59 has the gate coupled to control input 44, the drain coupled to node 52, and the source coupled to a terminal of a power supply $V_{dd}$.

Transistor 61 has the gate coupled to control input 44, the drain coupled to node 53, and the source coupled to the terminal of the power supply $V_{dd}$. In the preferred embodiment, transistors 59 and 61 have identical geometries. A bias voltage applied to input 44 affects the resistance of transistors 59 and 61. The resistance of transistors 59 and 61 should be such that the voltage drop from drain to source does not affect performance of differential transconductor 41.

Buffer 50 provides a low resistance output for differential transconductor 41 and load circuit 40. Buffer 50 also level shifts the output voltages at nodes 52 and 53. Buffer 50 includes a positive input coupled to node 53, a negative input coupled to node 52, a positive output 45, and a negative output 46. Buffer 50 comprises transistors 62 and 63, and current sources 64 and 66.

In the preferred embodiment, transistors 62 and 63 are npn bipolar transistors, each having a base, collector, and emitter corresponding to a control input, a first terminal, and a second terminal. Transistors 62 and 63 are configured as voltage followers. Transistor 62 has the base coupled to node 53, the collector coupled to the terminal of the power supply $V_{dd}$, and the emitter coupled to positive output 45. Transistor 63 has the base coupled to node 52, the collector coupled to the terminal of the power supply $V_{dd}$, and the emitter coupled to negative output 46. Current source 64 biases transistor 62 and includes a terminal coupled to positive output 45 and a terminal coupled to ground. Current source 66 biases transistor 63 and includes a terminal coupled to negative output 46 and a terminal coupled to ground. The emitters of transistors 62 and 63 are a $V_{be}$ below the respective voltages at nodes 53 and 52.

Under quiescent conditions (positive input 42 and negative input 43 are at identical voltages) the voltages at nodes 52 and 53 will also be equal. Similarly, the voltages at positive output 45 and negative output 46 are equal. A differential voltage applied across positive input 42 and negative input 43 will generate a corresponding differential voltage at positive output 45 and negative output 46. For example, assume transistors 48 and 49 have four times the emitter area of transistors 47 and 51. The transconductance of the input linearizer stage is defined by the bipolar transistor constant $V_t=kt/q$ and the current of current sources 57 and 58. Assume the current provide by current sources 57 and 58 equals $I_t$. The transconductance of differential transconductor 41 is approximately the value shown in equation 2.

$$g_m=(I_t/V_t)*(0.64) \quad (2)$$

Assume an input differential voltage across positive input 42 and negative input 43 of $V_{in}$. The transfer function of output differential current versus input differential voltage of transconductor 41 is described by equation 3.

$$I(V_{in})=I_t*TANH((V_{in}-V_t*ln(4))/(2*V_t))+I_t*TANH((V_{in}+V_t*ln(4))/(2*V_t)) \quad (3)$$

Equation 3 describes a relatively linear input/output transfer function for transconductor 41 over a wide input voltage range which significantly enhances performance of the modular filter described herein. Load circuit 50 provides a variable load which can be adjusted as the transconductance of transconductor 41 is varied. Buffer 50 isolates transconductor 41 and load circuit 40 from loads which might affect their operating characteristics.

Figure 3:
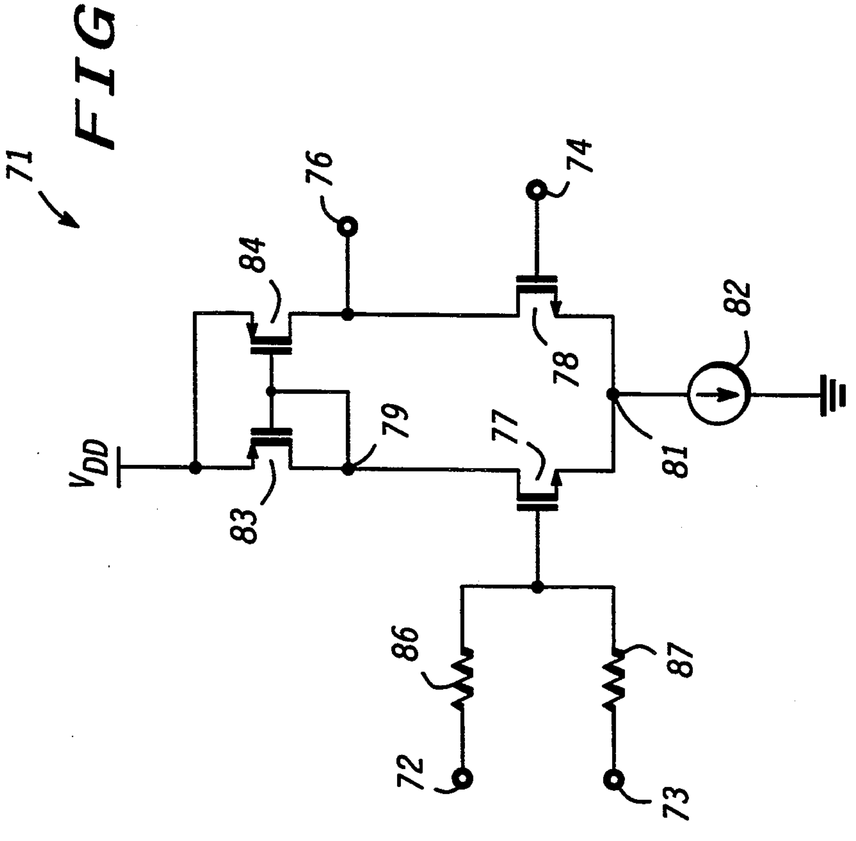
FIG. 3 is a schematic of a common mode amplifier in accordance with the present invention.

FIG. 3 is a schematic of a common mode amplifier 71 in accordance with the present invention. Common mode amplifier 71 is designed to control the bias on load circuit 15 (FIG. 1). Common mode amplifier 71 includes an input 72, an input 73, an input 74, and an output 76.

A resistor divider comprising resistors 86 and 87 provides a means for generating an average of the voltages at inputs 72 and 73. Resistor 86 includes a first terminal coupled to input 72 and a second terminal. Resistor 87 includes a first terminal coupled to input 73 and a second terminal coupled to the second terminal of resistor 86. In the preferred embodiment, resistors 86 and 87 have equal resistive values (R). For example, a voltage V1 is applied to input 72 and a voltage V2 is applied to input 73. The voltage at the common second terminals of resistors 86 and 87 is $V1-(V1-V2)(R/R+R)=(V1-V2)*0.50$, which is the average voltage at inputs 72 and 73. The difference between this average voltage and a common mode reference voltage applied to input 74 is amplified by common mode amplifier 71.

In the preferred embodiment, transistors 77 and 78 are n-channel enhancement MOSFETs. Transistor 77 has a gate coupled to a second terminal of resistor 86, a drain coupled to a node 79, and a source coupled to a node 81. Transistor 78 includes a gate coupled to input 74, a drain coupled to output 76, and a source coupled to node 81. A current source 82 biases transistors 77 and 78. Current source 82 has a terminal coupled to node 81 and a terminal coupled to ground. Transistors 77 and 78, and current source 82 form a differential input stage. The gate, drain, and source of transistors 77 and 78 corresponds respectively to a control input, a first terminal, and a second terminal.

In the preferred embodiment, transistors 83 and 84 are p-channel enhancement MOSFETs. Transistor 83 includes a gate coupled to node 79, a drain coupled to node 79, and a source coupled to a terminal of a power supply $V_{dd}$. Transistor 84 has a gate coupled to node 79, a drain coupled to output 76, and a source coupled to the terminal of the power supply $V_{dd}$. Transistors 83 and 84 form a current mirror circuit. The gate, drain, and source of transistors 83 and 84 correspond respectively to a control input, a first terminal, and a second terminal.

Common mode amplifier 71 provides an active means for adjusting load circuit 15 (FIG. 1) to compensate for changes in filter 11 (FIG. 1). For example, when the filter response is varied by changing transconductance. In the preferred embodiment, common mode amplifier 71 varies the bias of transistors 59 and 61 of load circuit 40 (FIG. 2). The difference voltage between the average voltage applied to inputs 72 and 73 and the common mode reference voltage applied to input 74 is amplified by common mode amplifier 71 as described previously. For example, assume common mode amplifier 71 is inserted for common mode amplifier 26 of FIG. 1. Inputs 72 and 73 receive the voltages at the positive and negative outputs of differential transconductor 18. Common mode amplifier 71 produces an output voltage to correct load circuit 15 such that the average voltage of inputs 72 and 73 is equal to the common mode reference voltage applied to input 14. Thus, transconductor 18 is operating optimally as its transconductance is varied. Under quiescent conditions the voltages at outputs 16 and 17 are equal to the are equal to the common mode reference voltage.

Figure 4:
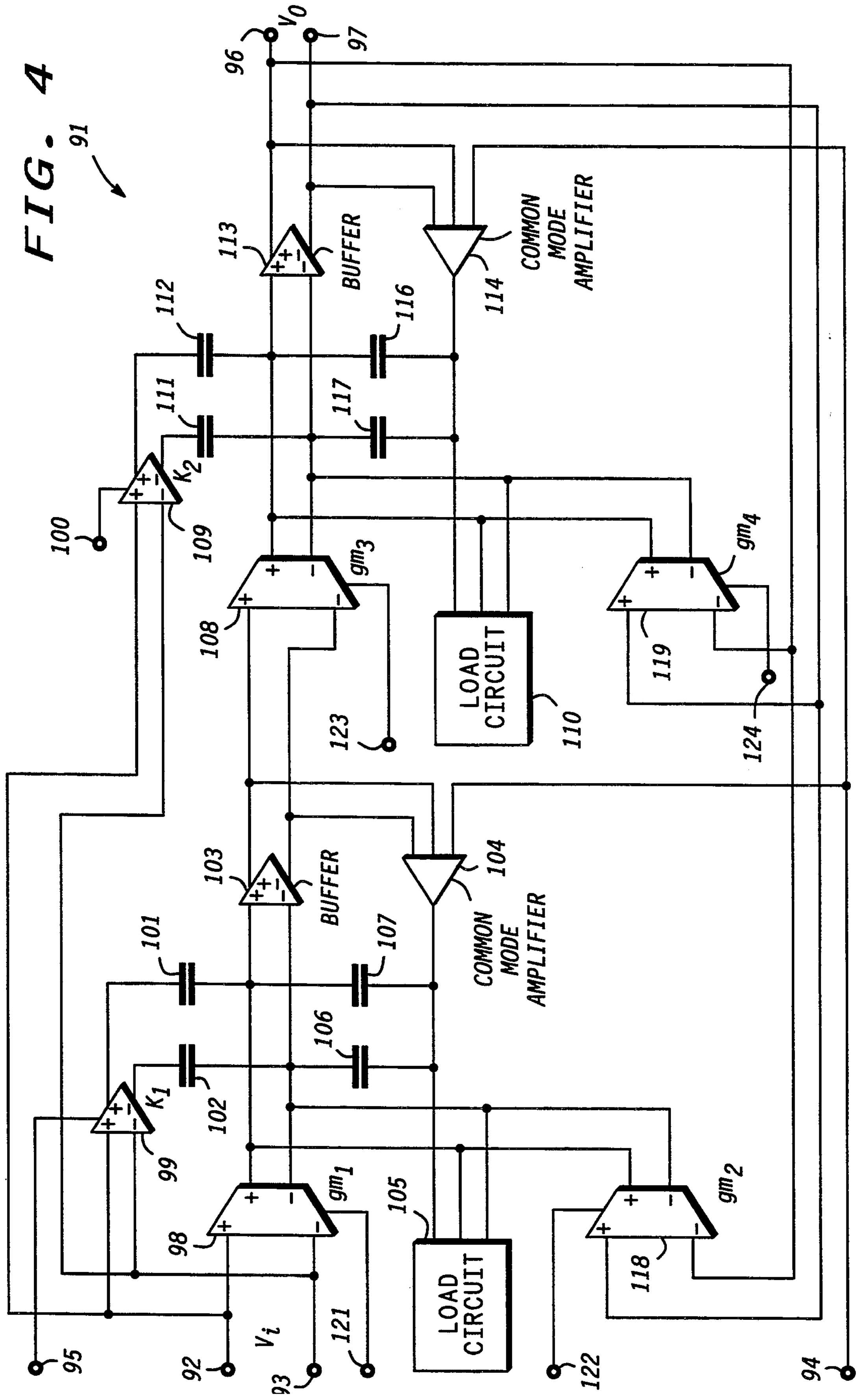
FIG. 4 is a block diagram of a biquadratic filter formed from the modular filter of FIG. 1.

FIG. 4 is a block diagram of a continuous time biquadratic filter 91. Biquadratic filter 91 can be operated at low voltages and has a wide operating range. Biquadratic filter 91 has an input 92, an input 93, a reference input 94, a control input 95, a control input 100, a control input 121, a control input 122, a control input 123, a control input 124, an output 96, and an output 97. Inputs 92 and 93 receive an input differential signal $V_i$ filtered by biquadratic filter 91 and provides an output differential signal $V_o$ at outputs 96 and 97. In the preferred embodiment, transconductors of biquadratic filter 91 are similar to that shown FIG. 2 and common mode amplifiers of biquadratic filter 91 are similar to that shown in FIG. 3. Note that biquadratic filter 91 is essentially two stages of modular filter 11 of FIG. 1. Common mode feedback is utilized to correct dc bias problems. All circuitry in biquadratic filter 91 is full differential to minimize power supply noise problems.

A transconductor 98 has a positive input coupled to input 92, a negative input coupled to input 93, a control input coupled to control input 121, a positive output, and a negative output. Transconductor 98 has a transconductance of $g_{m1}$ that is adjustable by varying a bias voltage applied to control input 121. A differential amplifier 99 having a gain of $K_1$ includes a positive input coupled to input 92, a negative input coupled to input 93, a control input coupled to control input 95, a positive output, and a negative output. The gain $K_1$ of differential amplifier 99 is adjustable by varying a bias voltage applied to control input 95. A capacitor 101 is coupled between the positive output of differential amplifier 99 and the positive output of transconductor 98. A capacitor 102 is coupled between the negative output of differential amplifier 99 and the negative output of transconductor 98. In the preferred embodiment, a buffer 103 provides increased drive capability. Buffer 103 includes a positive input coupled to the positive output of transconductor 98, a negative input coupled to the negative input of transconductor 98, a positive output, and a negative output.

A common mode amplifier 104 includes an input coupled to the positive output of buffer 103, an input coupled to the negative output of buffer 103, an input coupled to reference input 94, and an output. A common mode reference voltage is applied to reference input 94. Common mode amplifier 104 amplifies the voltage difference between the average of the voltages at the positive and negative outputs of buffer 103 and the common mode reference voltage applied to reference input 94. A capacitor 106 is coupled between the positive output of transconductor 98 and the output of common mode amplifier 104. A capacitor 107 is coupled between the negative output of transconductor 98 and the output of common mode amplifier 104. A load circuit 105 provides a load for generating a differential voltage at the positive and negative outputs of transconductor 98. The load circuit 105 includes a control input coupled to the output of common mode amplifier 104, a load terminal coupled to the positive output of transconductor 98, and a load terminal coupled to the negative output of transconductor 98. The load characteristics at either load terminal can be changed by varying the voltage applied to the control input of load circuit 105.

A transconductor 108 includes a positive input coupled to the positive output of buffer 103, a negative input coupled to the negative output of buffer 103, a control input coupled to the control input 123, a positive output, and a negative output. Transconductor 108 has a transconductance of $g_{m3}$ that is adjustable by varying a bias voltage applied to control input 123. A differential amplifier 109 has a gain $K_2$ and includes a positive input coupled to input 92, a negative input coupled to input 93, a control input coupled to control input 100, a positive output, and a negative output. The gain $K_2$ of differential amplifier 109 is adjustable by varying a bias voltage applied to control input 100. A capacitor 111 is coupled between the negative output of differential amplifier 109 and the negative output of transconductor 108. A capacitor 112 is coupled between the positive output of differential amplifier 109 and the positive output of transconductor 108. In the preferred embodiment, a buffer 113 provides increased drive capability. Buffer 113 includes a positive input coupled to the positive output of transconductor 108, a negative input coupled to the negative output of transconductor 108, a positive output coupled to output 96, and a negative output coupled to output 97.

A common mode amplifier 114 includes an input coupled to the positive output of buffer 113, an input coupled to the negative output of buffer 113, an input coupled to reference input 94, and an output. Common mode amplifier 114 amplifies the voltage difference between the average of the voltage at outputs 96 and 97 and the common mode reference voltage applied to reference input 94. A capacitor 116 is coupled between the positive output of transconductor 108 and the output of common mode amplifier 114. A capacitor 117 is coupled between the negative output of transconductor 108 and the output of common mode amplifier 114. A load circuit 110 provides a load for generating a differential voltage at the positive and negative outputs of transconductor 108. The load circuit 110 includes a control input coupled to the output of common mode amplifier 114, a load terminal coupled to the positive output of transconductor 108, and a load terminal coupled to the negative output of transconductor 108. The load characteristics at either load terminal can be changed by varying the voltage applied to the control input of load circuit 110.

A transconductor 118 includes a positive input coupled to output 97, a negative input coupled to output 96, a control input coupled to control input 122, coupled to the output of common mode amplifier 104, a positive output coupled to the positive output of transconductor 98, and a negative output coupled to the negative output of transconductor 98. Transconductor 118 has a transconductance of $g_{m2}$ that is adjustable by varying a bias voltage applied to control input 122. A transconductor 119 completes biquadratic filter 91. Transconductor 119 includes a positive input coupled to output 97, a negative input coupled to output 96, a control input coupled to the control input 124, a positive output coupled to the positive output of transconductor 108, and a negative output coupled to the negative output of transconductor 108. Transconductor 119 has a transconductance of $g_{m4}$ that is adjustable by varying a bias voltage applied to control input 124.

In the preferred embodiment, capacitors 101 and 102 have equal values ($C_1$), capacitors 106 and 107 have equal values ($C_2$), capacitors 111 and 112 have equal values ($C_3$), and capacitors 116 and 117 have equal values ($C_4$). The transfer function of biquadratic filter 91 can be described by equation 4.

$$V_o/V_i = (K_2(C_4/(C_3 + C_4))s^2 + K_1(g_{m3}/(C_3 + C_4))(C_2/(C_1 + C_2))s + g_{m1}g_{m3}/(C_1 + C_2)(C_3 + C_4))/(s^2 + g_{m4}(1/(C_3 + C_4))s + g_{m2}g_{m3}/(C_1 + C_2)(C_3 + C_4)). \quad (4)$$

The pole frequency $W_d$ from the denominator of the transfer function is described by equation 5.

$$W_d = \text{square root } (g_{m2}g_{m3}/(C_1+C_2)(C_3+C_4)). \quad (5)$$

The damping factor $D_{fd}$ of the denominator of the transfer function is described by equation 6.

$$D_f = 0.50*(g_{m4}/(\text{square root } (g_{m2}g_{m3}))*\text{square root } ((C_1+C_2)/(C_3+C_4)). \quad (6)$$

From the numerator of the transfer function, the zero frequency $W_n$ is described by equation 7.

$$W_n = \text{square root } (g_{m2}g_{m3}/(C_1+C_2)(C_3+C_4))*\text{square root } (g_{m2}/g_{m1})*\text{square root } ((C_3+C_4)/K_2C_4) \quad (7)$$

The damping factor $D_{fn}$ of the numerator of the transfer function is described by equation 8.

$$D_{fn} = 0.50 * (K_1C_2/(C_1 + C_2)) * \text{square root } ((C_3 + C_4)/K_2C_4) * (\text{square root } (g_{m1}g_{m3})/g_{m2}) * \text{square root } ((C_1 + C_2)/(C_3 + C_4)). \quad (8)$$

The characteristic poles, zeroes, and damping factors can be greatly simplified by adjusting the values of the transconductance and capacitors. The capacitors values are chosen such that $C_1+C_2=C_3+C_4=C_{total}$. A constant $A_1=C_2/(C_1+C_2)=C_3/(C_3+C_4)$. In addition, $g_{m1}=g_{m2}$ and $g_{m3}=g_{m4}$. The simplified pole frequency $W_{ds}$ is described by equation 9.

$$W_{ds} = (\text{square root } (g_{m1}g_{m3}))/C_{total}. \quad (9)$$

The simplified damping factor $D_{fds}$ for the denominator is described by equation 10.

$$D_{fds} = 0.50*\text{square root } (g_{m3}/g_{m1}). \quad (10)$$

The simplified zero frequency $W_{ns}$ from the numerator is described by equation 11.

$$W_{ns} = (\text{square root } (g_{m1}g_{m3}))/(C_{total}*\text{square root } (A_1K_2)). \quad (11)$$

The simplified damping factor $D_{fns}$=for the numerator is described by equation 12.

$$D_{fns} = 0.50*((A_1K_1)/\text{square root } (A_1K_2))*\text{square root } (g_{m3}/g_{m1}). \quad (12)$$

The equations 4–11 are used to choose transconductance, capacitance, and gain values for biquadratic filter 91. For example, biquadratic filter can be designed to form a low pass, high pass, notch, bandpass, etc. depending on the elements used. Programmability of biquadratic filter 91 is achieved by adjusting bias voltages on control inputs 95, 100, and 121–124. Common mode amplifiers 104 and 114 provide feedback for adjusting load circuits 105 and 110 as the transconductances is varied. Utilizing transconductors, load circuits, buffers, and common mode amplifiers as illustrated in FIGS. 2 and 3 in biquadratic filter 91 allows low voltage operation and wide operating range.

By now it should be appreciated that a filter has been described that is modular for forming different filtering functions, operates at low voltages with exceptional performance and range, and is stable from common mode oscillation.

I claim:

1. A modular filter with common mode feedback, the modular filter responsive to an applied input differential signal for providing a filtered output differential signal, the modular filter comprising:

a load circuit having a first terminal and a second terminal for summing signals applied thereto, said load circuit providing variable loads at said first and second terminals responsive to a control signal;

a first transconductor having a first transconductance which is responsive to the input differential signal for providing a differential signal to said first and second terminals of said load circuit;

an amplifier having a first predetermined gain and being capacitively coupled to said first and second terminals of said load circuit, said amplifier being responsive to the applied input differential signal for providing a differential signal to said first and second terminals of said load circuit;

a common mode amplifier capacitively coupled to said first and second terminals of said load circuit for providing common mode feedback, said common mode amplifier being responsive to the filtered output differential signal and a common mode reference voltage, said common mode amplifier providing said control signal for varying loading at said first and second terminals of said load circuit; and a second transconductor having a second transconductance responsive to the filtered output differential signal and providing a differential signal to said first and second terminals of said load circuit.

2. The modular filter as recited in claim 1 wherein said first transconductance, said second transconductance, and said first gain are adjustable for changing modular filter characteristics.

3. The modular filter as recited in claim 1 further including a buffer responsive to the filtered output differential signal for buffering the modular filter.

4. The modular filter as recited in claim 1 wherein said common mode amplifier further includes a resistor divider for averaging the filtered output differential signal, said common mode amplifier amplifying a difference between said common mode reference voltage and an average of the filtered output differential signal.

5. The modular filter as recited in claim 4 wherein said load circuit being responsive to said control signal provided by said common mode amplifier such that loading varies at said first and second terminals of said load circuit to maintain said average of the filtered output differential signal approximately equal to said common mode reference voltage.

6. The modular filter as recited in claim 1 wherein said amplifier includes a first output and a second output, a first capacitor being coupled between said first output of said amplifier and said first terminal of said load circuit, a second capacitor equal in magnitude to said first capacitor being coupled between said second output of said amplifier and said second terminal of said load circuit, said first and second capacitors capacitively coupling said differential signal of said amplifier to said load circuit.

7. The modular filter as recited in claim 1 wherein said common mode amplifier includes an output, a first capacitor being coupled between said output of said common mode amplifier and said first terminal of said load circuit, a second capacitor equal in magnitude to said first capacitor being coupled between said output of said common mode amplifier and said second terminal of said load circuit, said first and second capacitors capacitively coupling said control signal provided by said common mode amplifier to said load circuit.

8. A filter comprising:

a first transconductor including a first input, a second input, a first output, and a second output, said first and second inputs receiving an input differential voltage for filtering;

a first amplifier including a first input coupled to said first input of said first transconductor, a second input coupled to said second input of said first transconductor, a first output, and a second output;

a first capacitor coupled between said first output of said first transconductor and said first output of said first amplifier;

a second capacitor coupled between said second output of said first transconductor and said second output of said first amplifier;

a first common mode amplifier including a first input coupled to said first output of said first transconductor, a second input coupled to said second output of said first transconductor, a third input for receiving a common mode reference voltage, and an output;

a third capacitor coupled between said first output of said first transconductor and said output of said first common mode amplifier;

a fourth capacitor coupled between said second output of said first transconductor and said output of said first common mode amplifier;

a second transconductor including a first input coupled to said second output of said first transconductor, a second input coupled to said first output of said first transconductor, a first output coupled to said first output of said first transconductor, and a second output coupled to said second output of first transconductor; and a first load circuit including a first load terminal coupled to said first output of said first transconductor, a second load terminal coupled to said second output of said first transconductor, and a control input coupled to said output of said first common mode amplifier.

9. The filter as recited in claim 8 further including a first buffer for providing increased drive capability, said first buffer having a first input coupled to said first output of said first transconductor, a second input coupled to said second output of said first transconductor, a first output, and a second output.

10. A filter comprising:

a first transconductor including a first input, a second input, a first output, and a second output, said first and second inputs receiving an input differential voltage for filtering;

a first amplifier including a first input coupled to said first input of said first transconductor, a second input coupled to said second input of said first transconductor, a first output, and a second output;

a first capacitor coupled between said first output of said first transconductor and said first output of said first amplifier;

a second capacitor coupled between said second output of said first transconductor and said second output of said first amplifier;

a second transconductor including a first input, a second input, a first output coupled to said first output of said first transconductor, and a second output coupled to said second output of first transconductor;

a first buffer for providing increased drive capability, said first buffer having a first input coupled to said first output of said first transconductor, a second input coupled to said second output of said first transconductor, a first output, and a second output;

a first common mode amplifier including a first input coupled to said first output of said first buffer, a second input coupled to said second output of said first buffer, a third input for receiving a common mode reference voltage, and an output;

a third capacitor coupled between said first output of said first transconductor and said output of said first common mode amplifier;

a fourth capacitor coupled between said second output of said first transconductor and said output of said first common mode amplifier;

a first load circuit including a first load terminal coupled to said first output of said first transconductor, a second load terminal coupled to said second output of said first transconductor, and a control input coupled to said output of said first common mode amplifier;

a third transconductor including a first input coupled to said first output of said first buffer, a second input coupled to said second output of said first buffer, a first output, and a second output wherein said first and second inputs of said second transconductor respectively couples to said second and first outputs of said third transconductor;

a second amplifier including a first input coupled to said first input of said first transconductor, a second input coupled to said second input of said first transconductor, a first output, and a second output;

a fifth capacitor coupled between said first output of said second amplifier and said first output of said third transconductor;

a sixth capacitor coupled between said second output of said second amplifier and said second output of said third transconductor;

a second common mode amplifier including a first input coupled to said first output of said third transconductor, a second input coupled to said second output of said third transconductor, a third input receiving said common mode reference voltage, and an output;

a seventh capacitor coupled between said first output of said third transconductor and said output of said second common mode amplifier;

an eighth capacitor coupled between said second output of said third transconductor and said output of said second common mode amplifier;

a fourth transconductor including a first input coupled to said second output of said third transconductor, a second input coupled to said first output of said third transconductor, a first output coupled to said first output of said third transconductor, and a second output coupled to said second output of said third transconductor; and a second load circuit including a first load terminal coupled to said first output of said third transconductor, a second load terminal coupled to said second output of said third transconductor, and a control input coupled to said output of said second common mode amplifier.

11. The filter as recited in claim 10 further including a second buffer for providing increased drive capability having a first input coupled to said first output of said third transconductor, a second input coupled to said second output of said third transconductor, a first output, and a second output.

12. The filter as recited in claim 11 wherein said first and second buffers each comprise:

a first transistor of a first conductivity type having a control input coupled to said first input of said first or second buffer, a first terminal coupled to a terminal of a power supply, and a second terminal coupled to said first output of said first or second buffer;

a second transistor of said first conductivity type including a control input coupled to said second input of said first or second buffer, a first terminal coupled to said terminal of said power supply, and a second terminal corresponding to said second output of said first or second buffer;

a first current source for biasing said first transistor including a terminal coupled to said second terminal of said first transistor; and a second current source for biasing said second transistor including a terminal coupled to said second terminal of said second transistor.

13. The filter as recited in claim 10 wherein said first, second, third, and fourth transconductors each includes a control input for varying transconductance thereby allowing filter characteristics to be modified.

14. The filter as recited in claim 10 wherein said first and second amplifiers each includes a control input for varying gain thereby allowing filter characteristics to be modified.

15. The filter as recited in claim 10 wherein said first, second, third, and fourth transconductors each comprises:

a first transistor of a first conductivity type including a control input coupled to said first input of said first, second, third, or fourth transconductors, a first terminal coupled to said second output of said first, second, third, or fourth transconductors, and a second terminal;

a second transistor of said first conductivity type including a control input coupled to said control input of said first transistor, a first terminal coupled to said first terminal of said first transistor, and a second terminal;

a third transistor of said first conductivity type including a control input coupled to said second input of said first, second, third, or fourth transconductors, a first terminal coupled to said first output of said first, second, third, or fourth transconductors, and a second terminal coupled to said second terminal of said first transistor;

a fourth transistor of said first conductivity type including a control input coupled to said control input of said third transistor, a first terminal coupled to said first terminal of said third transistor, and a second terminal coupled to said second terminal of said second transistor;

a first current source for biasing said second and fourth transistors, said first current source including a terminal coupled to said second terminal of said second transistor; and a second current source for biasing said first and third transistors, said second current source including a terminal coupled to said second terminal of said first transistor.

16. The filter as recited in claim 15 wherein said first and second current sources supply equal current and wherein said first and second current sources include a common control input for varying current.

17. The filter as recited in claim 15 wherein said first and fourth transistors have an equal conductive area, wherein said second and third transistors have an equal conductive area, and wherein said conductive area of said second and third transistors is some multiple of said conductive area of said first and fourth transistors to increase input linearity.

18. The filter as recited in claim 10 wherein said first and second load circuits comprise:

a first transistor of a second conductivity type including a control input corresponding to said control input of said first and second load circuits, a first terminal corresponding to said first load terminal, and a second terminal coupled to a terminal of a power supply; and a second transistor of said second conductivity type including a control input coupled to said control input of said first transistor, a first terminal corresponding to said second load terminal, and a second terminal coupled to said terminal of said power supply.

19. The filter as recited in claim 10 wherein said first and second capacitors are equal in magnitude, wherein said third and fourth capacitors are equal in magnitude, wherein said fifth and sixth capacitors are equal in magnitude, and wherein said seventh and eighth capacitors are equal in magnitude.

20. A biquadratic filter utilizing common mode feedback, the biquadratic filter filtering an applied input differential signal and providing a filtered output differential signal, the biquadratic filter comprising:

a first load circuit having a first terminal and a second terminal for summing signals applied thereto, loading at said first and second terminals of said first load circuit being responsive to a first control signal;

a first transconductor of a first transconductance responsive to the input differential signal and providing a differential signal to said first and second terminals of said first load circuit;

a first amplifier of a first gain being capacitively coupled to said first and second terminals of said first load circuit, said first amplifier being responsive to the input differential signal and providing a differential signal to said first and second terminals of said first load circuit;

a first common mode amplifier capacitively coupled to first and second terminals of said first load circuit for providing common mode feedback, said first common mode amplifier being responsive to a voltage across said first and second terminals of said first load circuit and a common mode reference voltage, said first common mode amplifier providing said first control signal for varying loading at said first and second terminals of said first load circuit;

a second transconductor of a second transconductance responsive to said voltage across said first and second terminals of said first load circuit, said second transconductor providing a differential signal to said first and second terminals of said first load circuit;

a second load circuit having a first terminal and a second terminal for summing signals applied thereto, loading at said first and second terminals of said second load circuit being responsive to a second control signal, said first and second terminals of said second load circuit providing the filtered output differential signal;

a third transconductor of a third transconductance responsive to said voltage across first and second terminals of said first load circuit and providing a differential signal to said first and second terminals of said second load circuit;

a second amplifier of a second gain being capacitively coupled to said first and second terminals of said second load circuit, said second amplifier being responsive to the input differential signal and providing a differential signal to said first and second terminals of said second load circuit;

a second common mode amplifier capacitively coupled to said first and second terminals of said second load circuit for providing common mode feedback, said second common mode amplifier being responsive to the filtered output differential signal and said common mode reference voltage, said second common mode amplifier for providing said second control signal to said second load circuit for varying loading at said first and second terminals of said second load circuit; and a fourth transconductor of a fourth transconductance responsive to the filtered output differential signal, said fourth transconductor providing a differential signal to said first and second terminals of said second load circuit.

* * * * *